(12) United States Patent
Kageyama et al.

(10) Patent No.: US 8,216,745 B2
(45) Date of Patent: Jul. 10, 2012

(54) HALF-TONE MASK, HALF-TONE MASK BLANK AND METHOD FOR MANUFACTURING HALF-TONE MASK

(75) Inventors: Kagehiro Kageyama, Chichibu (JP); Fumihiko Yamada, Chichibu (JP)

(73) Assignee: ULVAC Coating Corporation, Saitama (JP)

( * ) Notice: Subject to any disclaimer, the term of this patent is extended or adjusted under 35 U.S.C. 154(b) by 235 days.

(21) Appl. No.: 12/740,645

(22) PCT Filed: Oct. 29, 2008

(86) PCT No.: PCT/JP2008/069691
§ 371 (c)(1),
(2), (4) Date: Apr. 29, 2010

(87) PCT Pub. No.: WO2009/057660
PCT Pub. Date: May 7, 2009

(65) Prior Publication Data
US 2010/0261096 A1    Oct. 14, 2010

(30) Foreign Application Priority Data
Nov. 1, 2007 (JP) ................................. 2007-284734

(51) Int. Cl.
*G06F 1/24* (2012.01)
(52) U.S. Cl. .......................................................... 430/5
(58) Field of Classification Search .............. 430/5, 322, 430/323, 394; 378/35
See application file for complete search history.

(56) References Cited

U.S. PATENT DOCUMENTS

| 2002/0122991 A1 | 9/2002 | Shiota et al. |
| 2005/0053845 A1 | 3/2005 | Becker et al. |
| 2006/0088774 A1* | 4/2006 | Yoshikawa et al. ............... 430/5 |
| 2007/0076833 A1 | 4/2007 | Becker et al. |

FOREIGN PATENT DOCUMENTS

| JP | 9-61987 A | 3/1997 |
| JP | 09-91987 | 4/1997 |
| JP | 2002-189281 | 7/2002 |
| JP | 2005-37933 | 2/2005 |
| JP | 2006-154122 | 6/2006 |
| KR | 2007-0077098 | 7/2007 |

OTHER PUBLICATIONS

Korean Office Action dated Feb. 6, 2012; Application No. 10-2010-7010968.

* cited by examiner

*Primary Examiner* — Stephen Rosasco
(74) *Attorney, Agent, or Firm* — Novak Druce + Quigg

(57) ABSTRACT

A halftone mask increasing the versatility of an etching stopper layer. The half tone mask (10) is provided with a transparent portion (TA) using a glass substrate (S), a first semi-transparent portion (HA) including a first semi-transparent layer (11) formed on the glass substrate, and a light shield portion (PA) including a first semi-transparent portion, a light shield layer (13) superimposed above the first semi-transparent layer, and an etching stopper layer (12) formed between the first semi-transparent layer and the light shield layer. The first semi-transparent layer and the light shield layer are each formed from Cr or at least one selected from the group consisting of an oxide, nitride, carbide, oxynitride, oxycarbide, carbonitride, and oxycarbonitride of Cr. The etching stopper layer includes a first element of at least one selected from the group consisting of Fe, Ni, and Co and a second element of at least one selected from the group consisting of Al, Si, Ti, Nb, Ta, Hf, and Zr.

20 Claims, 5 Drawing Sheets

(a)

(b)

(c)

(a)

(b)

(c)

(a)

(b)

(c)

(a)

(b)

(c)

(d)

(e)

(f)

(a)

(b)

(c)

(d)

HALF-TONE MASK, HALF-TONE MASK BLANK AND METHOD FOR MANUFACTURING HALF-TONE MASK

CROSS-REFERENCE TO RELATED APPLICATIONS

This application is a §371 national stage entry of International Application No. PCT/JP2008/069691, filed Oct. 29, 2008, which claims priority to Japanese Patent Application 2007-284734, filed Nov. 1, 2007, the entire contents of which are incorporated herein by reference.

TECHNICAL FIELD

The present invention relates to a halftone mask, a halftone mask blank, and a method for manufacturing a halftone mask.

BACKGROUND ART

In a manufacturing process for a flat panel display (FPD), to reduce manufacturing costs, a gray-tone mask is used to allow for two or more types of patterning. The gray-tone mask includes a light shield portion, which shields light, a transparent portion, which transmits light, and a semi-transparent portion, which partially transmits light. Gray-tone masks are categorized into a slit mask and a halftone mask in accordance with the structure of the semi-transparent portion.

The semi-transparent portion of a slit mask is formed by forming slits in a light shield layer, which is shared by the light shield portion, with a pitch that is less than or equal to the resolution limit. Enlargement of FPDs have enlarged the mask sizes. This has drastically increased the amount of data required to form the slits. Thus, in a process for manufacturing the slit masks, much time and money is necessary to form the slits. As a result, when manufacturing large FDPs that use slit masks, the cost for manufacturing large FDPs cannot be sufficiently reduced.

The semi-transparent portion of a halftone mask includes a semi-transparent layer that partially transmits light. There are two processes for manufacturing the halftone mask. The first manufacturing process forms a light shield layer on the substrate and etches the light shield layer to form the semi-transparent portion and the transparent portion. The other manufacturing process first sequentially superimposes a semi-transparent layer and a light shield layer on a substrate and then sequentially etches the light shield layer and the semi-transparent layer to form the light shield portion, the semi-transparent portion, and the transparent portion.

In the first manufacturing process, film formation and etching are alternately performed. This prolongs the processing time and makes it difficult to sufficiently reduce the manufacturing cost of the halftone mask. In the other manufacturing process, it is difficult to obtain etching selectivity between the semi-transparent layer and the light shield layer. Thus, it is difficult to obtain the required processing accuracy for the light shield portion and the semi-transparent portion. For this reason, proposals have been made to solve the above problems for the halftone mask manufacturing technology.

Patent document 1 and patent document 2 each sequentially superimpose a semi-transparent layer, an etching stopper layer, and a light shield layer on a substrate and then sequentially etches the light shield layer, the etching stopper layer, and the semi-transparent layer to form the light shield portion, the semi-transparent portion, and the transparent portion. In this case, the presence of the etching stopper layer substantially increases the etching selectivity for the light shield layer and the sere-transparent layer. This improves the processing accuracy of the halftone mask.

In patent document 1 and patent document 2, the material of the etching stopper layer is silicon oxide, silicon nitride, or silicon oxynitride. Alternatively, the material of the etching stopper layer is a metal oxide using a metal such as aluminum, hafnium, or zirconium. These materials each have a high etching selectivity for the light shield layer and the semi-transparent layer. However, to etch the etching stopper layer, these materials each require a dry etching technique, which uses a costly vacuum device, or a wet etching technique, which uses a fluorine etching liquid. As a result, the manufacturing cost is drastically increased when using the dry etching technique and environmental pollution is caused by fluorine exhaust gas when using the fluorine etching liquid. Further, when using the fluorine etching liquid, the management and recovery of the etching liquid is burdensome. This lowers versatility when manufacturing the etching stopper layer.

Patent Document 1: Japanese Laid-Open Patent Publication No. 2002-189281

Patent Document 2: Japanese Laid-Open Patent Publication No. 2006-154122

SUMMARY OF THE INVENTION

The present invention relates to a halftone mask, a halftone mask blank, and a method for manufacturing a halftone mask that improve the processing accuracy of a transparent portion, semi-transparent portion, and light, while increasing the versatility of the etching of the etching stopper layer.

A first aspect of the present invention is a halftone mask including a glass substrate. The half tone mask is provided with a transparent portion using the glass substrate. A first semi-transparent portion includes a first semi-transparent layer formed on the glass substrate. A light shield portion includes the first semi-transparent portion, a light shield layer superimposed above the first semi-transparent layer, and an etching stopper layer formed between the first semi-transparent layer and the light shield layer. The first semi-transparent layer and the light shield layer are each formed from Cr or at least one selected from the group consisting of an oxide, nitride, carbide, oxynitride, oxycarbide, carbonitride, and oxycarbonitride of Cr. The etching stopper layer includes a first element of at least one selected from the group consisting of Fe, Ni, and Co and a second element of at least one selected from the group consisting of Al, Si, Ti, Nb, Ta, Hf, and Zr.

A second aspect of the present invention is a halftone mask blank including a glass substrate. The halftone mask is provided with the glass substrate, a first semi-transparent portion layer formed on the glass substrate, a light shield layer superimposed above the first semi-transparent layer, and an etching stopper layer formed between the first semi-transparent layer and the light shield layer. The first semi-transparent layer and the light shield layer are each formed from Cr or at least one selected from the group consisting of an oxide, nitride, carbide, oxynitride, oxycarbide, carbonitride, and oxycarbonitride of Cr. The etching stopper layer includes a first element of at least one selected from the group consisting of Fe, Ni, and Co and a second element of at least one selected from the group consisting of Al, Si, Ti, Nb, Ta, Hf, and Zr.

A third aspect of the present invention is a method for manufacturing a halftone mask. The method includes superimposing a first semi-transparent layer on a glass substrate; superimposing a first etching stopper layer on the first semi-transparent layer, superimposing a light shield, layer above the first etching stopper layer; forming a first resist layer on the light shield layer; forming a transparent portion by sequentially etching the light shield layer, the first etching stopper layer, and the first semi-transparent layer using the first resist layer as a mask; removing the first resist layer; forming a second resist layer on the light shield layer so as to bury the transparent portion; forming a first semi-transparent portion by sequentially etching the light shield layer and the first etching stopper layer using the second resist layer as a mask; and removing the second resist layer. The first semi-transparent layer and the light shield layer are each formed from Cr or at least one selected from the group consisting of an oxide, nitride, carbide, oxynitride, oxycarbide, carbonitride, and oxycarbonitride of Cr. The etching stopper layer includes a first element of at least one selected from the group consisting of Fe, Ni, and Co and a second element of at least one selected from the group consisting of Al, Si, Ti, Nb, Ta, Hf, and Zr.

A fourth aspect of the present invention is a method for manufacturing a halftone mask. The method includes superimposing a first semi-transparent layer on a glass substrate; superimposing a first etching stopper layer on the first semi-transparent layer; superimposing a light shield layer above the first etching stopper layer; forming a resist layer on the light shield layer, the resist layer including a first recess, which extends therethrough to the light shield layer, and a second recess, which is shallower than the first recess; forming a transparent portion by sequentially etching the fight shield layer, the first etching stopper layer, and the first semi-transparent layer through the first recess using the first resist layer as a mask; removing an upper surface of the resist layer so that the second recess extends to the light shield layer; forming a first semi-transparent portion after removing the upper surface of the resist layer by sequentially etching the light shield layer and the first etching stopper layer through the second recess using the remaining resist layer as a mask; and removing the remaining resist layer. The first semi-transparent layer and the light shield layer are each formed from Cr or at least one selected from the group consisting of an oxide, nitride, carbide, oxynitride, oxycarbide, carbonitride, and oxycarbonitride of Cr. The etching stopper layer includes a first element of at least one selected from the group consisting of Fe, Ni, and Co and a second element of at least one selected from the group consisting of Al, Si, Ti, Nb, Ta, Hf, and Zr.

DESCRIPTION OF REFERENCE NUMERALS

HA ... semi-transparent portion, PA ... light shield portion, TA ... transparent portion, 10 ... halftone mask, 11 ... semi-transparent layer, 12 ... etching stopper layer, 13 ... light shield layer, 14 ... halftone mask blank, 15 ... resist layer forming a resist pattern

DETAILED DESCRIPTION OF THE INVENTION

Figure 1:
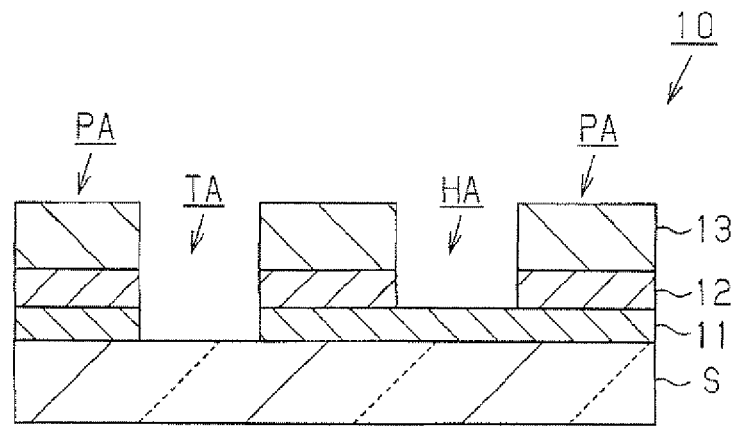
FIG. 1 is a cross-sectional side view showing a halftone mask.
Figure 2:
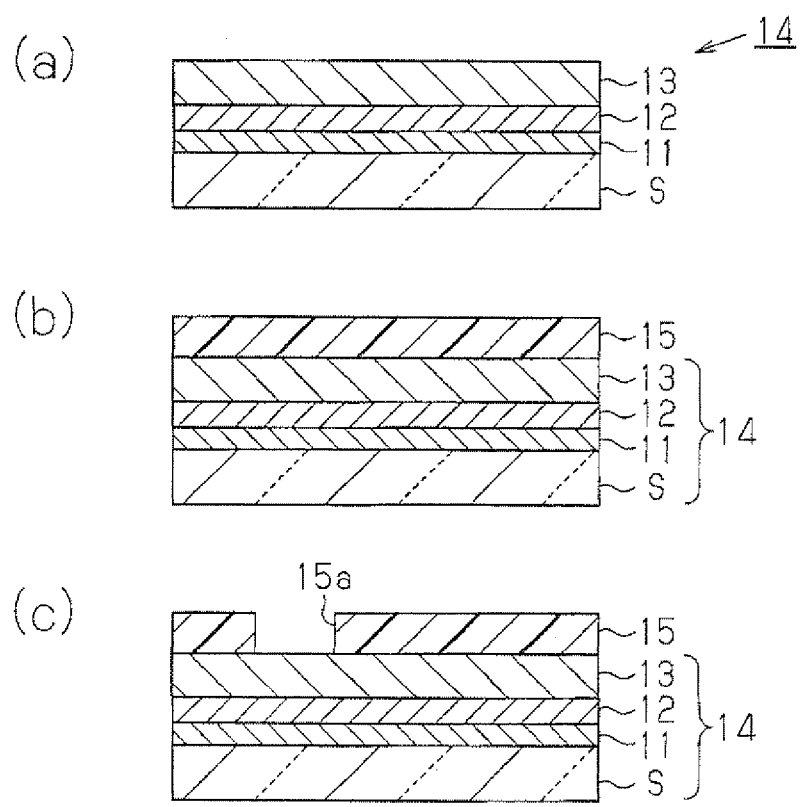
FIGS. 2(a) to 2(c) are diagrams showing the procedures for manufacturing the halftone mask.
Figure 3:
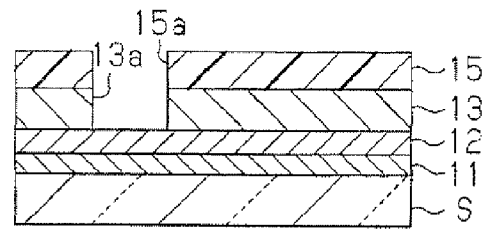
FIGS. 3(a) to 3(c) are diagrams showing the procedures for manufacturing the halftone mask.
Figure 3:
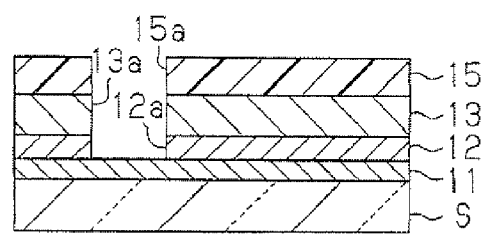
Figure 3:
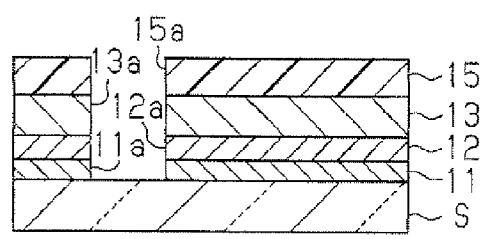
Figure 4:
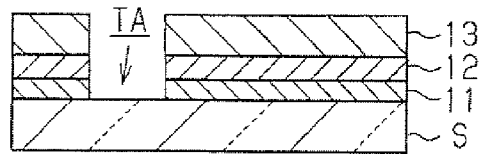
FIGS. 4(a) to 4(c) are diagrams showing the procedures for manufacturing the halftone mask.
Figure 4:
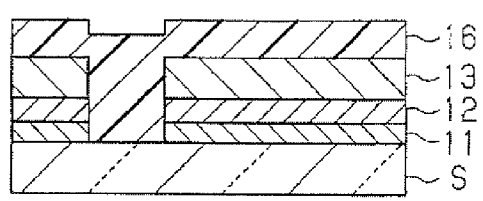
Figure 4:
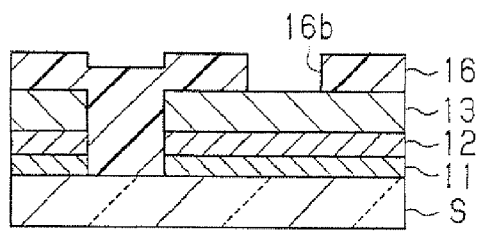
Figure 5:
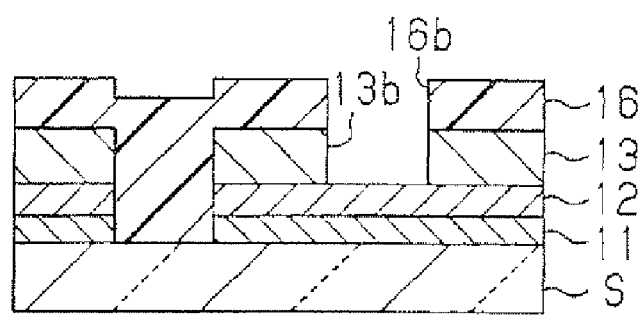
FIGS. 5(a) to 5(c) are diagrams showing the procedures for manufacturing the halftone mask.
Figure 5:
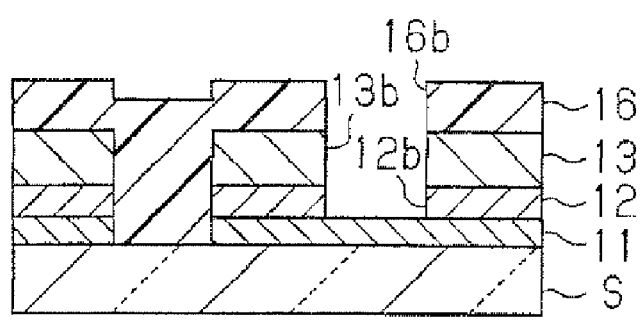
Figure 5:
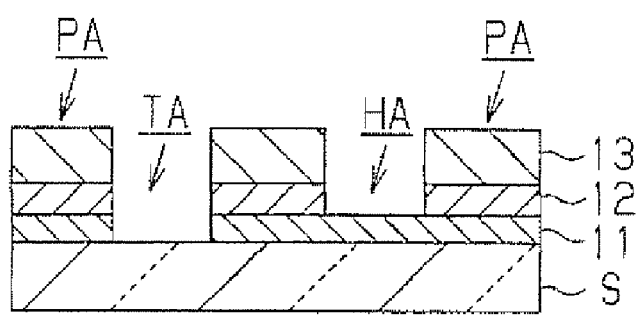

A halftone mask 10 according to one embodiment of the present invention will now be discussed with reference the drawings. FIG. 1 is a cross-sectional diagram showing the main part of the halftone mask 10.

[Halftone Mask 10]

As shown in FIG. 1, a semi-transparent layer 11, an etching stopper layer 12, and a light shield layer 13 are sequentially superimposed on a glass substrate S of a halftone mask 10. The halftone mask 10 includes a transparent layer (glass substrate S), the light shield layer 13, and the semi-transparent layer 11, which differs from the transparent layer and the light shield layer 13. The semi-transparent layer 11 has a transmittance that is used to obtain exposure amounts for a plurality of tones. The halftone mask 10 has a transparent portion TA, which is formed by the glass substrate S, and a semi-transparent portion HA, which includes the semi-transparent layer 11 on the glass substrate S. Further, the halftone mask 10 has a light shield portion PA, which includes the semi-transparent layer 11, the etching stopper layer 12, and the light shield layer 13 on the glass substrate S.

In FIG. 1, the halftone mask 10 has a single semi-transparent layer 11 and a single etching stopper layer 12. However, there is no limitation, and the halftone mask 10 may be a so-called multi-tone mask having a plurality of semi-transparent layers 11 and a plurality of etching stopper layers 12 superimposed on the glass substrate S. In a multi-tone mask, at least one additional semi-transparent layer and at least one additional etching stopper layer are alternatively formed on the etching stopper layer 12. Further, the light shield layer 13 is formed on the uppermost etching stopper layer.

The semi-transparent layer 11 and the light shield layer 13 each have a main component of Cr or at least one selected from the group consisting of an oxide, nitride, carbide, oxynitride, oxycarbide, carbonitride, and oxycarbonitride of Cr.

In the present embodiment, the etching liquid applied to the semi-transparent layer 11 and the light shield layer 13 is referred to as a first etching liquid. The first etching liquid includes a cerium nitrate such as a liquid mixture of diammonium cerium nitrate and perchloric acid.

The semi-transparent layer 11 and the light shield layer 13 each has a main component, which may be an alloy that can be etched by the first etching liquid. More specifically, the main component of the semi-transparent layer 11 and the light shield layer 13 may be selected from at least one of the group consisting of NiCr, NiV, NiMo, and NiMoX (where X is Al, Ti, Nb, Ta, or V).

The etching stopper layer 12 includes at least one selected from the group consisting of Fe, Ni, and Co (hereinafter simply referred to as the first element) and at least one selected from the group consisting of Al, Si, Ti, Nb, Ta, Hf, and Zr (hereinafter simply referred to as the second element). In addition to the first element and the second element, the etching stopper layer 12 may be formed from at least one selected from the group consisting of V, Mo, W, Cu, and Zn (hereinafter simply referred to as the third element). Further, the etching stopper layer 12 may be an alloy of the first element and the second element, an alloy of the first element, the second element, and the third element, or one selected from the group consisting of oxide, nitride, carbide, oxynitride, oxycarbide, carbonitride, and oxycarbonitride of these alloys.

The first element, which is the main component of the etching stopper layer 12, has a higher heat resistance than the second element and the third element. Thus, the first element allows for the halftone mask 10 to lengthen the exposure time and eliminates restrictions related to the exposure time.

When exposed to the first etching liquid, the first element forms a passivation layer on its surface and thus becomes resistant to the first etching liquid. Since it is difficult for the first etching liquid to corrode the etching stopper layer 12, a satisfactory etching selectivity is obtained for the light shield layer 13 and the etching stopper layer 12.

The first element easily dissolves in nitric acid. Thus, an etching liquid including nitric acid is applicable for etching the etching stopper layer 12. The etching liquid including nitric acid substantially does not corrode the semi-transparent layer 11. Thus, a satisfactory etching selectivity is obtained for the etching stopper layer 12 and the semi-transparent layer 11. A state in which there is substantially no corrosion refers to a state in which process variations do not occur in subsequent processes, as compared with a state in which there is no corrosion.

In the present embodiment, the etching liquid applied to the etching stopper layer 12 is referred to as a second etching liquid. The second etching liquid is nitric acid or a mixture of nitric acid with a carboxylic acid, such as acetic acid, oxalic acid, formic acid, or citric acid. Further, the second etching liquid may be a mixture of nitric acid with phosphoric acid, sulfuric acid, or perchloric acid. Further, when mixing nitric acid with a carboxylic acid, such as oxalic acid, acetic acid, formic acid, or citric acid, it is preferred that nitric acid having a low concentration be used.

The second etching liquid may also be obtained by mixing salt in nitric acid. For example, the second etching my be obtained by mixing nitric acid with nitrate salt such as silver nitrate, phosphoric salt such as ammonium phosphate, acetate salt such as ammonium acetate, oxalate, formate, carboxylate, or chlorate. When mixing an oxidizing salt with nitric acid, the oxidizing salt enhances the formation of the passivation layer. Thus, it is preferred that the content amount of the oxidizing salt be selected in accordance with the etching speed of the etching stopper layer 12 with respect to the second etching liquid.

An etching liquid including hydrochloric acid generates a mist containing chlorine gas. Thus, the management and recovery of the etching liquid is burdensome. An etching liquid including hydrofluoric acid is highly permeable by the human body and highly corrosive to the surrounding facilities. Thus, in addition to the management and recovery being burdensome, exclusive etching facilities are necessary, and cost reduction becomes difficult.

In contrast, the second etching liquid described above allows for use of the same etching facilities as the first etching liquid. Further, from the viewpoint of management and recovery, the second etching liquid is more versatile compared to an etching liquid including hydrochloric acid or hydrofluoric acid.

When the etching stopper layer 12 is exposed to the first etching liquid, the second element added to the etching stopper layer 12 forms a passivation layer, the main element of which is the second element, on the surface of the etching stopper layer 12. Thus, the etching stopper layer 12 including the second element further stabilizes the passivation layer from a layer that includes only the first element. As a result, the etching stopper layer 12 obtains a further satisfactory etching selectivity with respect to the light shield layer 13 without being substantially corroded by the first etching liquid. Further, the etching stopper layer 12 allows for the thickness of the passivation layer, that is, the etching speed of the etching stopper layer 12, to be set based on the content amount of the second element. Thus, the second etching liquid obtains a further satisfactory etching selectivity with respect to the light shield layer 13. Accordingly, the halftone mask 10, which uses the etching stopper layer 12, increases versatility, lowers costs, and increases processing accuracy.

The content amount of the second element is preferably 1 atomic percent to 20 atomic percent, more preferably, 5 atomic percent to 18 atomic percent, and further preferably, 9 atomic percent to 14 atomic percent. When the content amount of the second element is less that 1 atomic percent, sufficient resistance to the first etching liquid cannot be obtained. When the content amount of the second element exceeds 20 atomic percent, the resistance to the second etching liquid becomes high, and the etching of the etching stopper layer 12 becomes difficult.

The third element added to the etching stopper layer 12 has etching characteristics with respect to the second etching liquid that are more satisfactory than the first element and the second element. Thus, the etching stopper layer 12 to which the third element is added increases the etching speed of the second etching liquid in accordance with the content amount of the third element. In other words, with the etching stopper layer 12, adjustment of the content amount of the third element sets the etching speed of the second etching liquid and reduces the time and cost of the etching process.

The content amount of the third element is preferably 10 atomic percent or less, more preferably, 8 atomic percent or less, and further preferably, 6 atomic percent or less. When the content amount of the second element exceeds 10 atomic percent, sufficient resistance to the first etching liquid cannot be obtained.

The thickness of the etching stopper layer 12 is preferably greater than 6 nm and less than or equal to 50 nm, more preferably, 8 nm to 40 nm, and further preferably, 10 nm to 30 nm. When the thickness of the etching stopper layer 12 is 6 nm or less, a deficiency occurs, such as the formation of pin holes in the etching stopper layer 12. This makes it difficult for the etching stopper layer 12 to function as a stopper layer. When the thickness of the etching stopper layer 12 exceeds 50 nm, much time is required to etch the etching stopper layer 12. This drastically lowers the productivity of the halftone mask 10.

[First Manufacturing Method]

Figure 6:
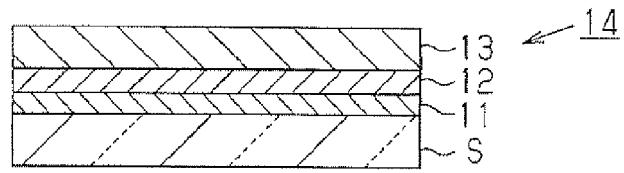
FIGS. 6(a) to 6(f) are diagrams showing the procedures for manufacturing the halftone mask.
Figure 6:
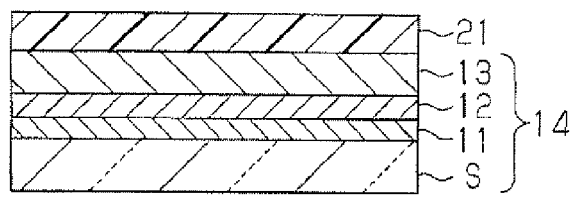
Figure 6:
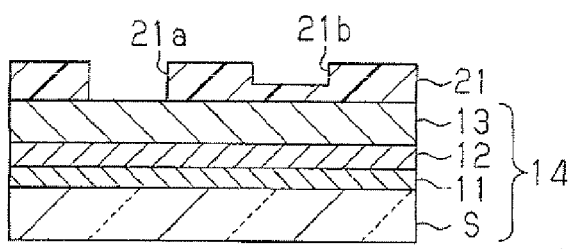
Figure 6:
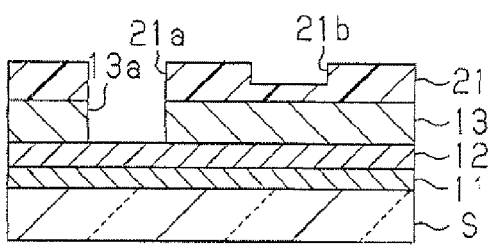
Figure 6:
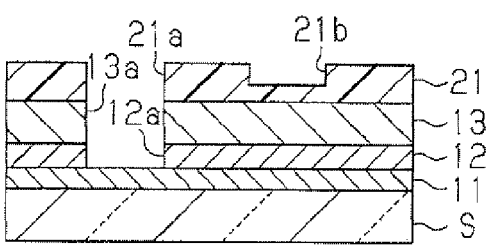
Figure 6:
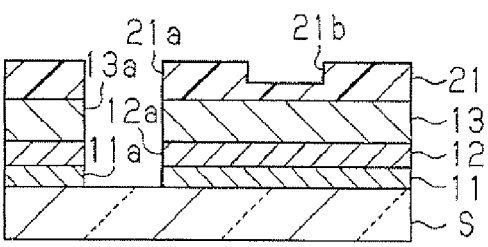
Figure 7:
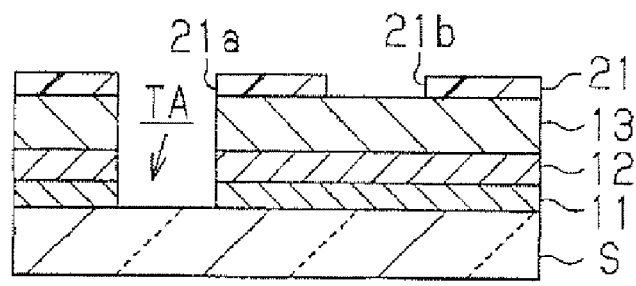
FIGS. 7(a) to 7(d) are diagrams showing the procedures for manufacturing the halftone mask.
Figure 7:
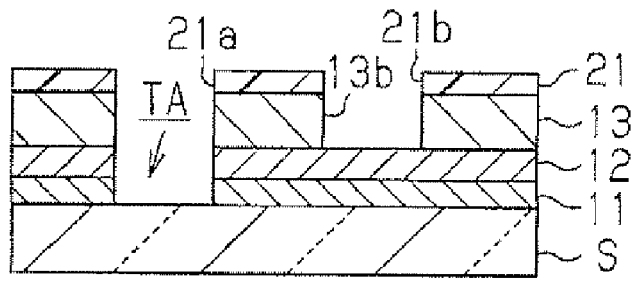
Figure 7:
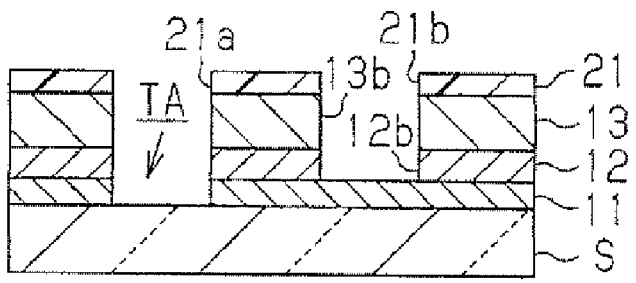
Figure 7:
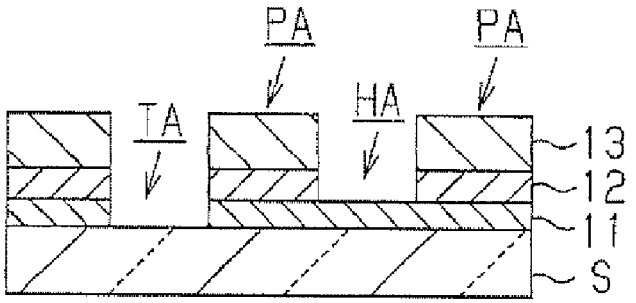

Methods for manufacturing the halftone mask 10 will now be discussed with reference to FIGS. 2 to 7. FIGS. 2 to 5 are diagrams showing the procedures for a first manufacturing method. FIGS. 6 and 7 are diagrams showing the procedures for a second manufacturing method.

Referring to FIG. 2(a), sputtering is first performed sequentially form the semi-transparent layer 11, the etching stopper layer 12, and the light shield layer 13 on the glass substrate S to obtain a halftone mask blank 14. The semi-transparent layer 11, the etching stopper layer 12, and the light shield layer 13 are formed by performing direct current sputtering, high-frequency sputtering, vapor deposition, CVD, ion beam sputtering, or the like.

The preferable process for forming the etching stopper layer 12 is sputtering since high thickness uniformity may be obtained. When performing sputtering, Ar may be used as the sputtering gas. Further, nitrogen, oxygen, carbon dioxide, carbon monoxide, nitrogen monoxide, nitrogen dioxide, dinitrogen monoxide, methane, and the like may be used as the reactive gas. When the rate of oxidation, oxynitrification, and nitrification increases, the resistance of the etching stopper layer 12 to the first etching liquid decreases. Accordingly, the amount of the reactive gas relative to the sputtering gas is preferably 10% or less and more preferably 5% or less.

Referring to FIG. 2(b), when the halftone mask blank 14 is formed, a resist material is applied to the light shield layer 13. The resist material is prebaked to form a first resist layer 15. Referring to FIG. 2(c), the first resist layer 15 undergoes an exposure process, which uses an exposure apparatus such as a laser exposure apparatus, and a development process, which uses an alkali solution such as potassium hydroxide. This forms an opening (hereinafter referred to as the transparent portion opening 15a) in the first resist layer 15 for forming the transparent portion TA.

Referring to FIG. 3(a), etching is performed with the first etching liquid on the light shield layer 13 using the first resist layer 13 as a mask. This forms a first light shield layer opening 13a in correspondence with the transparent portion opening 15a.

Here, part of the etching stopper layer 12 is exposed to the first etching liquid through the first light shield layer opening 13a but is substantially not corroded by the first etching liquid. Thus, the etching stopper layer 12 substantially stops etching performed by the first etching liquid in the depthwise direction at the surface of the etching stopper layer 12.

Referring to FIG. 3(b), etching is performed with the second etching liquid on the etching stopper layer 12 through the first light shield layer opening 13a. This forms a first stopper layer opening 12a in correspondence with the first light shield layer opening 13a.

Here, the second etching liquid uses the same etching facility as the first etching liquid. Further, the management and recovery of the first and second etching liquids is simple. This increases the versatility for the etching of the etching stopper layer 12. Additionally, the etching stopper layer 12 lowers the etching speed as the content rate of the second element increases and raises the etching speed as the content rate of the third element increases. That is, the etching stopper layer 12 is etched at a desired etching speed that is in accordance with the content amount of the second element or the content amount of the third element. Accordingly, adjustment of the content amount of the second element or the third element allows for the etching time to be shortened. Further, the light shield layer 13 is substantially not corroded by the second etching liquid. Thus, the first stopper layer opening 12a, which is formed through the first light shield layer opening 13a, reflects the shape and size of the transparent portion opening 15a with high accuracy. Further, the semi-transparent layer 11 is not corroded by the second etching liquid. Thus, the semi-transparent layer 11 substantially stops etching performed by the second etching liquid in the depthwise direction at the surface of the semi-transparent layer 11.

Referring to FIG. 3(c), etching is performed with the first etching liquid on the semi-transparent layer 11 through the first stopper layer opening 12a to form a semi-transparent layer opening 11a corresponding to the transparent portion opening 15a. This forms the transparent portion TA. In this case, since the etching stopper layer 12 is not corroded by the first etching liquid, the shape and size of the semi-transparent layer opening 11a reflects the shape and size of the transparent portion opening 15a with high accuracy. In other words, the transparent portion TA is processed with high accuracy to have a shape and size corresponding to the shape and size of the transparent portion opening 15a.

Referring to FIG. 4(a), an alkali solution or the like is supplied entirely to the glass substrate S to remove the first resist layer 15 from the light shield layer 13. Then, referring to FIG. 4(b), a resist material is applied entirely to the light shield layer 13 including the transparent portion TA, and the resist material is prebaked to form a second resist layer 16. Referring to FIG. 4(c), the second resist layer 16 undergoes an exposure process, which uses an exposure apparatus such as a laser exposure apparatus, and a development process, which uses an alkali solution such as potassium hydroxide. This forms an opening (hereinafter referred to as the semi-transparent portion opening 16b) in the second resist layer 16 for forming the semi-transparent portion HA.

Referring to FIG. 5(a), etching is performed with the first etching liquid on the light shield layer 13 using the second resist layer 15 as a mask. This forms a second light shield layer opening 13b in correspondence with the semi-transparent portion opening 16b.

Here, in the same manner as when forming the first light shield layer opening 13a, the etching stopper layer 12 is not corroded by the first etching liquid. Thus, etching performed by the first etching liquid is substantially stopped in the depthwise direction at the surface of the etching stopper layer 12.

Referring to FIG. 5(b), etching is performed with the second etching liquid on the etching stopper layer 12 through the second light shield layer opening 13a. This forms a second stopper layer opening 12b in correspondence with the second light shield layer opening 13b. Then, referring to FIG. 5(c), an alkali solution or the like is supplied entirely to the glass substrate S to remove the second resist layer 16 from the light shield layer 13. This forms the semi-transparent portion HA and the light shield portion PA.

Here, in the same manner as when forming the first stopper layer opening 12a, the use of the second etching liquid increases the versatility for the etching of the etching stopper layer 12. Additionally, the etching stopper layer 12 is etched at an etching speed that is in accordance with the content amount of the second element or the content amount of the third element. Thus, adjustment of the content amount of the second element or the third element allows for the etching time to be shortened.

Further, the semi-transparent layer 11 is substantially not corroded by the second etching liquid. Thus, the shape and size of the second stopper layer opening 12b reflects the shape and size of the semi-transparent portion opening 16b with high accuracy. In other words, the semi-transparent portion HA is processed with high accuracy to have a shape and size corresponding to the shape and size of the semi-transparent portion opening 16b.

When forming the halftone mask 10 as a multi-tone mask, the semi-transparent layer 11 and the etching stopper layer 12 are repeatedly superimposed on the glass substrate S. Further, the light shield layer 13 is formed on the uppermost etching stopper layer 12 to obtain the halftone mask blank 14.

Then, the transparent portion opening 15a is formed in the light shield layer 13, and the light shield layer 13 undergoes etching. Afterwards, etching of the etching stopper layer 12 and etching of the semi-transparent layer 11 are alternately repeated to form the transparent portion TA. Subsequently, the semi-transparent portion opening 16b is formed, and the light shield layer 13 is etched. Then, etching of the etching stopper layer 12 and etching of the semi-transparent layer 11 are repeated for a predetermined number of times to form the semi-transparent portion HA with a plurality of semi-transparent layers 11. The formation of the semi-transparent portion openings 16b, etching of the light shield layer 13, etching of the predetermined number of etching stopper layers 12, and etching of the predetermined number of semi-transparent layers 11 are repeated to form a plurality of semi-transparent portions HA having different numbers of semi-transparent layers 11.

[Second Manufacturing Method]

Referring to FIGS. 6(a) and 6(b), in the same manner as the first manufacturing method, the semi-transparent layer 11, the etching stopper layer 12, and the light shield layer 13 are sequentially formed on the glass substrate S to obtain a halftone mask blank 14. Then, a resist material, is applied to the light shield layer 13, and the resist material is prebaked to form a third resist layer 21.

Referring to FIG. 6(c), the third resist layer 21 undergoes an exposure process, which uses an exposure apparatus such as a laser exposure apparatus, and a development process, which uses an alkali solution such as potassium hydroxide. Here, a region at which the transparent portion TA is formed and a region at which the semi-transparent portion HA is formed are irradiated with exposure lights of different exposure amounts. For example, in the region in which the transparent portion TA is formed, the resist material of the third resist layer 21 is entirely removed in the depthwise direction. Further, in the region in which the semi-transparent portion HA is formed, the resist material is removed halfway from the surface of the third resist layer 21 in the depthwise direction. This forms in the third resist layer 21 a recess for forming the transparent portion TA (hereinafter referred to as the transparent portion recess 21a) and a recess for forming the semi-transparent portion HA (hereinafter referred to as the semi-transparent portion recess 21b). The transparent portion recess 21a, which is deeper than the semi-transparent portion recess 21b, extends through the third resist layer 21 to the light shield layer 13.

Referring to FIG. 6(d), etching is performed with the first etching liquid on the light shield layer 13 using the third resist layer 21 as a mask. This forms a first light shield layer opening 13a in correspondence with the transparent portion recess 21a. Referring to FIG. 6(e), in the same manner as in the first manufacturing process, etching is performed with the second etching liquid on the etching stopper layer 12 through the first light shield layer opening 13a. This forms a first stopper layer opening 12a in correspondence with the first light shield layer opening 13a. Referring to FIG. 6(f), in the same manner as in the first manufacturing process, etching is performed with the first etching liquid on the semi-transparent layer 11 through the first stopper layer opening 12a to form a semi-transparent layer opening 11a corresponding to the transparent portion opening 15a. This forms the transparent portion TA.

Referring to FIG. 7(a), the glass substrate S entirely undergoes asking to extend the semi-transparent portion recess 21b through the light shield layer 13. Then, referring to FIG. 7(b), etching is performed with the first etching liquid on the light shield layer 13 using the third resist layer 21 as a mask. This forms a second light shield layer opening 13b in correspondence with the semi-transparent portion recess 21b.

Here, in the same manner as when forming the first light shield layer opening 13a, the etching stopper layer 12 is not corroded by the first etching liquid. Thus, etching performed by the first etching liquid is substantially stopped in the depthwise direction at the surface of the etching stopper layer 12.

Referring to FIG. 7(c), in the same manner as in the first manufacturing method, etching is performed with the second etching liquid on the etching stopper layer 12 through the second light shield layer opening 13a. This forms a second stopper layer opening 12b in correspondence with the second light shield layer opening 13b. Then, referring to FIG. 7(d), an alkali solution or the like is supplied entirely to the glass substrate S to remove the third resist layer 21 from the light shield layer 13. This forms the semi-transparent portion HA and the light shield portion PA.

Here, the semi-transparent layer 11 is substantially not corroded by the second etching liquid. Thus, the shape and size of the second stopper layer opening 12b reflects the shape and size of the semi-transparent portion recess 21b with high accuracy. In other words, the semi-transparent portion HA is processed with high accuracy to have a shape and size corresponding to the shape and size of the semi-transparent portion recess 21b.

When forming the halftone mask 10 as a multi-tone mask, the semi-transparent layer 11 and the etching stopper layer 12 are repeatedly superimposed on the glass substrate S. Further, the light shield layer 13 is formed on the uppermost etching stopper layer 12 to obtain the halftone mask blank 14.

Next, the transparent portion recess 21a and a plurality of semi-transparent portion recesses 21b, the depths of which differ from the transparent portion recess 21a, are formed in the light shield layer 13. Then, the light shield layer 13 undergoes etching. Afterwards, etching of the etching stopper layer 12 and etching of the semi-transparent layer 11 are alternately repeated to form the transparent portion TA. Further, partial aching of the third resist layer 21, etching of the semi-transparent layer 11, etching of a predetermined number of etching stopper layers 12, and etching of a predetermined number of semi-transparent layers 11 are repeated to form a plurality of transparent portions TA having different numbers of semi-transparent layers 11.

Example 1

The glass substrate S was loaded into a sputtering apparatus to apply a Cr compound ($CrO_x$, $CrO_xN_y$, or $CrN_x$) to the glass substrate S and form the semi-transparent layer 11. Then, $Ni_{88}Ti_{12}$ was applied to the semi-transparent layer 11 to form the etching stopper layer 12. Further, a Cr compound ($CrO_x$, $CrO_xN_y$, or $CrN_x$) was applied to the etching stopper layer 12 to form the light shield layer 13 and obtain the halftone mask blank 14.

Photoresist AZP 1500 (manufactured by AZ Electronic Materials) was applied to the light shield layer 13 of the halftone mask blank 14, heated to 100° C., and baked for 30 minutes to form the first resist layer 15. Then, an exposure process and a development process using a potassium hydroxide development liquid were performed on the first resist layer 15 to form the transparent portion opening 25a. Then, the light shield layer 13 was etched with a diammonium cerium nitrate liquid. Next, the etching stopper layer 12 was etched with an aqueous solution containing 23 mol % of nitric acid, and the diammonium cerium nitrate liquid was used again to etch the semi-transparent layer 11 and form the transparent portion TA.

After the formation of the transparent portion TA, an aqueous solution containing 3 percent by mass of sodium hydroxide was supplied entirely to the glass substrate S to remove the first resist layer 15. Next, the photoresist AZP 1500 was applied again to the light shield layer 13 including the transparent portion TA, heated to 100° C., and baked for 30 minutes to form the second resist layer 16. Then, an exposure process and a development process using a potassium hydroxide development liquid were performed on the second resist layer 16 to form the semi-transparent portion opening 16b. Further, the light shield layer 13 was etched with the diammonium cerium nitrate liquid, and the etching stopper layer 12 was etched with an aqueous solution containing 23 mol % of nitric acid to form the semi-transparent portion HA and the light shield portion PA.

After the formation of the semi-transparent portion HA and the light shield portion PA, an aqueous solution containing 3 percent by mass of sodium hydroxide was supplied entirely to the glass substrate S to remove the second resist layer 16. The halftone mask 10 of example 1 was obtained in this manner.

Example 2

The etching stopper layer 12 was changed to $Ni_{90}Al_{10}$, and the second etching liquid was changed to a liquid mixture of nitric acid and sulfuric acid (nitric acid: 20 mol %, sulfuric acid: 5 mol %). The other conditions were the same as example 1 to obtain the halftone mask 10 of example 2.

Example 3

The etching stopper layer 12 was changed to $Ni_{92}Fe_3Nb_5$, and the second etching liquid was changed to a liquid mixture of nitric acid and sulfuric acid (nitric acid: 20 mol %, sulfuric acid: 5 mol %). The other conditions were the same as example 1 to obtain the halftone mask 10 of example 3.

Example 4

The etching stopper layer 12 was changed to $Ni_{83}V_5Si_2Ti_{10}$, and the second etching liquid was changed to a liquid mixture of nitric acid and phosphoric acid (nitric acid: 20 mol %, phosphoric acid: 5 mol %). The other conditions were the same as example 1 to obtain the halftone mask 10 of example 4.

Example 5

The etching stopper layer 12 was changed to $Ni_{92}Mo_3Zr_5$, and the second etching liquid was changed to a liquid mixture of nitric acid, phosphoric acid, and acetic acid (nitric acid: 20 mol %, phosphoric acid: 5 mol %, acetic acid: 5 mol %). The other conditions were the same as example 1 to obtain the halftone mask 10 of example 5.

Example 6

The etching stopper layer 12 was changed to $Ni_{84}Cu_3Ti_{13}$, and the second etching liquid was changed to a liquid mixture of nitric acid and silver nitrate (nitric acid: 20 mol %, silver nitrate: 5 mol %). The other conditions were the same as example 1 to obtain the halftone mask 10 of example 6.

Example 7

The etching stopper layer 12 was changed to $Ni_{89}Cu_3Ta_8$, and the second etching liquid was changed to a liquid mixture of nitric acid, phosphoric acid, and ammonium phosphate (nitric acid: 20 mol %, phosphoric acid: 5 mol %, ammonium phosphate: 5 mol %). The other conditions were the same as example 1 to obtain the halftone mask 10 of example 7.

Example 8

The etching stopper layer 12 was changed to $Co_{56}Ni_{30}V_2Ti_{12}$, and the second etching liquid was changed to a liquid mixture of nitric acid, sulfuric acid, and ammonium sulfate (nitric acid: 20 mol %, sulfuric acid: 5 mol %, ammonium sulfate: 5 mol %). The other conditions were the same as example 1 to obtain the halftone mask 10 of example 8.

Example 9

The etching stopper layer 12 was changed to $Ni_{85}W_2Mo_2Ti_{11}$, and the second etching liquid was changed to a liquid mixture of nitric acid and perchloric acid (nitric acid: 20 mol %, perchloric acid: 5 mol %). The other conditions were the same as example 1 to obtain the halftone mask 10 of example 9.

Example 10

The etching stopper layer 12 was changed to $Ni_{86}Zn_1Cu_2Ti_{11}$, and the second etching liquid was changed to a liquid mixture of nitric acid and ammonium nitrate (nitric acid: 20 mol %, ammonium nitrate: 5 mol %). The other conditions were the same as example 1 to obtain the halftone mask 10 of example 10.

Example 11

The etching stopper layer 12 was changed to $Ni_{91}Mo_2Hf_7$. The other conditions were the same as example 1 to obtain the halftone mask 10 of example 11.

Comparative Example 1

The etching stopper layer 12 was changed to $Ni_{70}Zr_{30}$. The other conditions were the same as example 1 to obtain the halftone mask 10 comparative example 1.

Comparative Example 2

The etching stopper layer 12 was changed to $Ni_{90}Cu_{10}$. The other conditions were the same as example 1 to obtain the halftone mask 10 comparative example 2.

Table 1 shows the etching evaluation results of the etching stopper layer 12 for each of the examples 1 to 11 and the comparative examples 1 and 2. In table 1, a circle indicates that etching of the etching stopper layer 12 was possible and that sufficient selectivity was obtained for the semi-transparent layer 12 or the light shield layer 13. Further, in table 1, a cross indicates that etching of the etching stopper layer 12 was impossible or that sufficient selectivity was not obtained for the semi-transparent layer 12 or the light shield layer 13.

As shown in table 1, in examples 1 to 11, etching of the etching stopper layer 12 was possible and sufficient selectivity was obtained for the semi-transparent layer 12 or the light shield layer 13. In comparative example 1, the etching stopper layer 12 was continuously supplied with the second etching liquid for thirty minutes. However, etching of the etching stopper layer 12 was impossible. In comparative example 2, the light shield layer 13 was etched, the etching stopper layer 12 and semi-transparent layer 11 were etched, and sufficient selectivity was not obtained for each of the layers.

TABLE 1

| Etching Stopper Layer | 2nd Etching Liquid | Etching Results |
|---|---|---|
| Ex. 1 $Ni_{88}$—$Ti_{12}$ | 23% of nitric acid | ○ |
| Ex. 2 $Ni_{90}$—$Al_{10}$ | 20% of nitric acid + 5% of sulfuric acid | ○ |
| Ex. 3 $Ni_{92}$—$Fe_3$—$Nb_5$ | 20% of nitric acid + 5% of sulfuric acid | ○ |
| Ex. 4 $Ni_{83}$—$V_5$—$Si_2$—$Ti_{10}$ | 20% of nitric acid + 5% of phosphoric acid | ○ |
| Ex. 5 $Ni_{92}$—$Mo_3$—$Zr_5$ | 20% of nitric acid + 5% of phosphoric acid + 5% of acetic acid | ○ |
| Ex. 6 $Ni_{84}$—$Cu_3$—$Ti_{13}$ | 20% of nitric acid + 5% of silver nitrate | ○ |

TABLE 1-continued

| | Etching Stopper Layer | 2nd Etching Liquid | Etching Results |
|---|---|---|---|
| Ex. 7 | $Ni_{89}$—$Cu_3$—$Ta_8$ | 20% of nitric acid + 5% of phosphoric acid + 5% of ammonium phosphate | ○ |
| Ex. 8 | $Co_{56}$—$Ni_{30}$—$V_2$—$Ti_{12}$ | 20% of nitric acid + 5% of sulfuric acid + 5% of ammonium sulfate | ○ |
| Ex. 9 | $Ni_{85}$—$W_2$—$Mo_2$—$Ti_{11}$ | 20% of nitric acid + 5% of perchloric acid | ○ |
| Ex. 10 | $Ni_{86}$—$Zn_1$—$Cu_2$—$Ti_{11}$ | 20% of nitric acid + 5% of ammonium nitrate | ○ |
| Ex. 11 | $Ni_{91}$—$Mo_2$—$Hf_7$ | 23% of nitric acid | ○ |
| Com. Ex. 1 | $Ni_{70}$—$Zr_{30}$ | 23% of nitric acid | x |
| Com. Ex. 2 | $Ni_{90}$—$Cu_{10}$ | 23% of nitric acid | x |

Example 12

The etching stopper layer 12 was changed to $Ni_{90}Al_{10}$, $Ni_{92}Fe_3Nb_5$, $Ni_{83}V_5Ti_{12}$, and $Ni_{92}Mo_3Zr_5$. The other conditions were the same as in example 1 to obtain each halftone mask 10 of example 12. In each example 12, etching of the etching stopper layer 12 was possible and sufficiently high selectivity was obtained for the semi-transparent layer 12 or the light shield layer 13.

Example 13

The glass substrate S was loaded into a sputtering apparatus to apply a Cr compound ($CrO_x$, $CrO_xN_y$, or $CrN_x$) to the glass substrate S and form the semi-transparent layer 11. Then, $Ni_{88}Ti_{12}$ was applied to the semi-transparent layer 11 to form the etching stopper layer 12. Further, a Cr compound ($CrO_x$, $CrO_xN_y$, or $CrN_x$) was applied to the etching stopper layer 12 to form the light shield layer 13 and obtain the halftone mask blank 14.

Photoresist AZP 1500 (manufactured by AZ Electronic Materials) was applied to the light shield layer 13 of the halftone mask blank 14, heated to 100° C., and baked for 30 minutes to form the third resist layer 21. Then, a region of the third resist layer 21 corresponding to the transparent portion TA was exposed by an exposure amount of 100% and a region of the third resist layer 21 corresponding to the half-transparent portion HA was exposed by an exposure amount of 50%. Further, a development process using a potassium hydroxide development liquid was performed on the third resist layer 15 to form the transparent portion recess 21a and the semi-transparent portion recess 21b.

After the formation of the transparent portion recess 21a and the semi-transparent portion recess 21b, the light shield layer 13 was etched with a diammonium cerium nitrate liquid. Next, the etching stopper layer 12 was etched with an aqueous solution containing 23 mol % of nitric acid, and the diammonium cerium nitrate liquid was used again to etch the semi-transparent layer 11 and form the transparent portion TA.

After the formation of the transparent portion TA, an $O_2$ ashing process was entirely performed on the glass substrate until the semi-transparent portion recess 21b was extended through the light shield layer 13. Next, the light shield layer 13 was etched with a diammonium cerium nitrate liquid using the third resist layer 21 as a mask. Then, the etching stopper layer 12 was etched using an aqueous solution containing 23 mol % of nitric acid. This formed the semi-transparent portion HA and the light shield portion PA.

After the formation of the semi-transparent portion HA and the light shield portion PA, an aqueous solution containing 3 percent by mass of sodium hydroxide was supplied entirely to the glass substrate S to remove the second resist layer 16. The halftone mask 10 of example 1 was obtained in this manner. In example 13, etching of the etching stopper layer 12 was possible and sufficiently high selectivity was obtained for the semi-transparent layer 12 or the light shield layer 13.

Example 14

The glass substrate S was loaded into a sputtering apparatus to apply a Cr compound ($CrO_x$, $CrO_xN_y$, or $CrN_x$) to the glass substrate S and form a semi-transparent layer 11 (first semi-transparent: layer). Then, $Ni_{88}Ti_{12}$ was applied to the first semi-transparent layer 11 to form a first etching stopper layer 12. Subsequently, a second semi-transparent layer 11 and a second etching stopper layer 12 were alternately formed once, and a Cr compound ($CrO_x$, $CrO_xN_y$, or $CrN_x$) was applied to the second etching stopper layer 12, which was the uppermost layer. This obtained the halftone mask blank 14 including two semi-transparent layers 11 and two etching stopper layers 12 and the light shield layer 13.

Photoresist AZP 1500 (manufactured by AZ Electronic Materials) was applied to the light shield layer 13 of the halftone mask blank 14, heated to 100° C., and baked for 30 minutes to form the first resist layer 15. Then, an exposure process and a development process using a potassium hydroxide development liquid were performed on the first resist layer 15 to form the transparent portion opening 15a. Then, the light shield layer 13 was etched with a diammonium cerium nitrate liquid. After further etching the second etching stopper layer 12 with an aqueous solution containing 23 mol % of nitric acid, the diammonium cerium nitrate liquid was used to etch the second semi-transparent layer 11. Subsequently, the first etching stopper layer 12 and the first semi-transparent layer 11 were sequentially etched to form the transparent portion TA.

After the formation of the transparent portion TA, an aqueous solution containing 3 percent by mass of sodium hydroxide was supplied entirely to the glass substrate S to remove the first resist layer 15. Next, the photoresist AZP 1500 was applied again to the light shield layer 13 including the transparent portion TA, heated to 100° C., and baked for 30 minutes to form the second resist layer 16. Then, an exposure process and a development process using a potassium hydroxide development liquid were performed on the second resist layer 16 to form the semi-transparent portion opening 16b. Further, the light shield layer 13 was etched with the diammonium cerium nitrate liquid, and the second etching stopper layer 12 was etched with an aqueous solution containing 23 mol % of nitric acid. This formed a first semi-transparent portion HA including two semi-transparent layers 11 and one etching stopper layer 12.

After the formation of the semi-transparent portion HA, an aqueous solution containing 3 percent by mass of sodium hydroxide was supplied entirely to the glass substrate S to remove the second resist layer 16. Next, the photoresist AZP 1500 was applied again to the light shield layer 13 including the transparent portion TA, heated to 100° C., and baked for 30 minutes to form the second resist layer 16. Then, an exposure process and a development process using a potassium hydroxide development liquid were performed on the second resist layer 16 to form a semi-transparent portion opening 16b at a position differing from the position where the first semi-transparent portion HA was formed. Further, the light shield layer 13 was etched with the diammonium cerium nitrate liquid. Then, the second etching stopper layer 12 was etched with an aqueous solution containing 23 mol % of nitric acid. The first etching stopper layer 12 was further etched with the aqueous solution containing 23 mol % of nitric acid. This formed a second semi-transparent portion HA including one semi-transparent layer 11.

The halftone mask 10 of the embodiment has the advantages described below.

(1) The etching stopper layer 12 includes the first element, which is at least one selected from the group consisting of Fe, Ni, and Co, and the second element, which is at least one selected from the group consisting of Al, Si, Ti, Nb, Ta, Hf, and Zr.

Accordingly, when the etching stopper layer 12 is exposed to the first etching liquid, a passivation layer, the main component of which is the second element, is formed on the surface of the etching stopper layer 12. Thus, the etching stopper layer 12 has satisfactory selectivity for the light shield layer 13. Further, the first element is easily dissolved in nitric acid. Thus, the etching stepper layer 12 has satisfactory selectivity for the semi-transparent layer 11. Since the management and recovery is simple for the first and second etching liquids of the etching stopper layer 12, the versatility of the etching stopper layer 12 is drastically improved in contrast with an etching liquid including hydrochloric acid or hydrofluoric acid. As a result, the halftone mask 10 increases the processing accuracy of the semi-transparent portion TA, the semi-transparent portion HA, and the light shield portion PA, while increasing versatility with respect to the etching of the etching stopper layer 12.

(2) The etching stopper layer 12 includes one selected from the group consisting of V, Mo, W, Cu, and Zn. Thus, the halftone mask 10 adjusts the etching speed of the etching stopper layer 12 by adjusting the content rate of the third element. Accordingly, the halftone mask 10 shortens the processing time and reduces costs when the etching stopper layer 12 is etched.

We claim:

1. A halftone mask including a glass substrate, the halftone mask comprising:
    a transparent portion using the glass substrate;
    a first semi-transparent portion including a first semi-transparent layer formed on the glass substrate; and
    a light shield portion including the first semi-transparent layer, a light shield layer superimposed above the first semi-transparent layer, and an etching stopper layer formed between the first semi-transparent layer and the light shield layer;
    wherein the first semi-transparent layer and the light shield layer are each formed from Cr or at least one selected from a group consisting of an oxide, nitride, carbide, oxynitride, oxycarbide, carbonitride, and oxycarbonitride of Cr; and
    the etching stopper layer includes a first element of at least one selected from a group consisting of Fe, Ni, and Co and a second element of at least one selected from a group consisting of Al, Si, Ti, Nb, Ta, Hf, and Zr.

2. The halftone mask according to claim 1, wherein the second element has a content ratio of 1 atomic percent to 20 atomic percent.

3. The halftone mask according to claim 1, wherein the etching stopper layer further includes a third element of at least one selected from the group consisting of V, Mo, W, Cu, and Zn.

4. The halftone mask according to claim 3, wherein the second element has a content ratio of 1 atomic percent to 20 atomic percent; and
    the third element has a content ratio of 10 atomic percent or less.

5. The halftone mask according to claim 1, wherein the etching stopper layer includes an alloy, which comprises the first element and the second element, or one selected from the group consisting of an oxide, nitride, carbide, oxynitride, oxycarbide, carbonitride, and oxycarbonitride of the alloy.

6. The halftone mask according to claim 1, further comprising:
    a second semi-transparent portion including the first semi-transparent layer, a second semi-transparent layer superimposed above the first semi-transparent layer, and an etching stopper layer arranged between the first semi-transparent layer and the second semi-transparent layer; and
    the second transparent layer is formed from Cr or at least one selected from a group consisting of an oxide, nitride, carbide, oxynitride, oxycarbide, carbonitride, and oxycarbonitride of Cr.

7. A halftone mask blank comprising:
    a glass substrate;
    a first semi-transparent layer formed on the glass substrate;
    a light shield layer superimposed above the first semi-transparent layer; and
    an etching stopper layer formed between the first semi-transparent layer and the light shield layer;
    wherein the first semi-transparent layer and the light shield layer are each formed from Cr or at least one selected from a group consisting of an oxide, nitride, carbide, oxynitride, oxycarbide, carbonitride, and oxycarbonitride of Cr; and
    the etching stopper layer includes a first element of at least one selected from a group consisting of Fe, Ni, and Co and a second element of at least one selected from a group consisting of Al, Si, Ti, Nb, Ta, Hf, and Zr.

8. The halftone mask blank according to claim 7, wherein the second element has a content ratio of 1 atomic percent to 20 atomic percent.

9. The halftone mask blank according to claim 7, wherein the etching stopper layer further includes a third element of at least one selected from the group consisting of V, Mo, W, Cu, and Zn.

10. The halftone mask blank according to claim 9, wherein the second element has a content ratio of 1 atomic percent to 20 atomic percent; and
    the third element has a content ratio of 10 atomic percent or less.

11. The halftone mask blank according to claim 7, wherein the etching stopper layer includes an alloy, which comprises the first element and the second element, or one selected from a group consisting of an oxide, nitride, carbide, oxynitride, oxycarbide, carbonitride, and oxycarbonitride of the alloy.

12. The halftone mask blank according to claim 7, further comprising:
    a second semi-transparent layer formed between the etching stopper layer and the light shield layer, wherein the second semi-transparent layer is formed from Cr or at least one selected from a group consisting of an oxide, nitride, carbide, oxynitride, oxycarbide, carbonitride, and oxycarbonitride of Cr.

13. A method for manufacturing a halftone mask, the method comprising:
    superimposing a first semi-transparent layer on a glass substrate;

superimposing a first etching stopper layer on the first semi-transparent layer;

superimposing a light shield layer above the first etching stopper layer;

forming a first resist layer on the light shield layer;

forming a transparent portion by sequentially etching the light shield layer, the first etching stopper layer, and the first semi-transparent layer using the first resist layer as a mask;

removing the first resist layer;

forming a second resist layer on the light shield layer so as to bury the transparent portion;

forming a first semi-transparent portion by sequentially etching the light shield layer and the first etching stopper layer using the second resist layer as a mask; and removing the second resist layer;

wherein the first semi-transparent layer and the light shield layer are each formed from Cr or at least one selected from a group consisting of an oxide, nitride, carbide, oxynitride, oxycarbide, carbonitride, and oxycarbonitride of Cr; and the etching stopper layer includes a first element of at least one selected from a group consisting of Fe, Ni, and Co and a second element of at least one selected from a group consisting of Al, Si, Ti, Nb, Ta, Hf, and Zr.

14. A method for manufacturing a halftone mask, the method comprising:

superimposing a first semi-transparent layer on a glass substrate;

superimposing a first etching stopper layer on the first semi-transparent layer;

superimposing a light shield layer above the first etching stopper layer;

forming a resist layer on the light shield layer, the resist layer including a first recess, which extends therethrough to the light shield layer, and a second recess, which is shallower than the first recess;

forming a transparent portion by sequentially etching the light shield layer, the first etching stopper layer, and the first semi-transparent layer through the first recess using the first resist layer as a mask;

removing an upper surface of the resist layer so that the second recess extends to the light shield layer;

forming, after removing the upper surface of the resist layer, a first semi-transparent portion by sequentially etching the light shield layer and the first etching stopper layer through the second recess using the remaining resist layer as a mask; and removing the remaining resist layer;

wherein the first semi-transparent layer and the light shield layer are each formed from Cr or at least one selected from a group consisting of an oxide, nitride, carbide, oxynitride, oxycarbide, carbonitride, and oxycarbonitride of Cr; and the first etching stopper layer includes a first element of at least one selected from a group consisting of Fe, Ni, and Co and a second element of at least one selected from a group consisting of Al, Si, Ti, Nb, Ta, Hf, and Zr.

15. The method for manufacturing a halftone mask according to claim 13, wherein the second element has a content ratio of 1 atomic percent to 20 atomic percent.

16. The method for manufacturing a halftone mask according to claim 13, wherein the first etching stopper layer further includes a third element of at least one selected from the group consisting of V, Mo, W, Cu, and Zn.

17. The method for manufacturing a halftone mask according to claim 16, wherein the second element has a content ratio of 1 atomic percent to 20 atomic percent; and the third element has a content ratio of 10 atomic percent or less.

18. The method for manufacturing a halftone mask according to claim 13, wherein the first etching stopper layer includes an alloy, which comprises the first element and the second element, or one selected from a group consisting of an oxide, nitride, carbide, oxynitride, oxycarbide, carbonitride, and oxycarbonitride of the alloy.

19. The method for manufacturing a halftone mask according to claim 13, further comprising:

etching the first etching stopper layer with an etching liquid including nitric acid.

20. The method for manufacturing a halftone mask according to claim 13, further comprising:

forming a second semi-transparent layer on the first etching stopper layer before superimposing the light field layer and forming a second etching stopper layer on the second semi-transparent layer, the light shield layer being superimposed on the second etching stopper layer;

wherein the transparent portion is formed by sequentially etching the light shield layer, the second etching stopper layer, the second semi-transparent layer, the first etching stopper layer, and the first semi-transparent layer using the first resist layer as a mask;

the first semi-transparent portion is formed by sequentially etching the light shield layer, the second etching stopper layer, the second semi-transparent layer, and the first etching stopper layer using the second resist layer as a mask;

the method further comprising:

after removing the second resist layer, forming a second semi-transparent portion at a position differing from the first semi-transparent portion by sequentially etching the light shield layer and the second etching stopper layer using a further second resist layer as a mask.

* * * * *